US006805964B2

(12) United States Patent
Clouser et al.

(10) Patent No.: US 6,805,964 B2
(45) Date of Patent: Oct. 19, 2004

(54) PROTECTIVE COATINGS FOR IMPROVED TARNISH RESISTANCE IN METAL FOILS

(75) Inventors: Sidney J. Clouser, Chardon, OH (US); Michael A. Centanni, Parma, OH (US)

(73) Assignee: Nikko Materials USA, Inc., Chandler, AZ (US)

( * ) Notice: Subject to any disclaimer, the term of this patent is extended or adjusted under 35 U.S.C. 154(b) by 24 days.

(21) Appl. No.: 10/395,334

(22) Filed: Mar. 24, 2003

(65) Prior Publication Data

US 2003/0178139 A1 Sep. 25, 2003

Related U.S. Application Data

(60) Division of application No. 09/714,811, filed on Nov. 15, 2000, now Pat. No. 6,537,675, which is a continuation-in-part of application No. 09/211,283, filed on Dec. 14, 1998, now Pat. No. 6,299,721.

(51) Int. Cl.$^7$ ............................................. B32B 15/04
(52) U.S. Cl. ....................... 428/450; 428/447; 428/448; 428/336; 428/615; 428/617; 428/618; 428/621; 428/650
(58) Field of Search ................................ 428/332, 334, 428/335, 336, 447, 448, 450, 615, 617, 618, 621, 650

(56) References Cited

U.S. PATENT DOCUMENTS

| 3,644,166 | A | * | 2/1972 | Gause ......................... 442/23 |
| 4,875,283 | A | | 10/1989 | Johnston |
| 5,153,050 | A | | 10/1992 | Johnston |
| 5,338,619 | A | | 8/1994 | Fukuda et al. |
| 5,567,534 | A | | 10/1996 | Yano et al. |
| 5,605,958 | A | | 2/1997 | Yoneda et al. |
| 5,622,782 | A | * | 4/1997 | Poutasse, III et al. ...... 428/344 |
| 5,700,362 | A | | 12/1997 | Yano et al. |
| 5,712,047 | A | * | 1/1998 | Aso et al. ................... 428/607 |
| 5,908,544 | A | | 6/1999 | Lee et al. |
| 5,962,113 | A | | 10/1999 | Brown et al. |
| 5,976,702 | A | | 11/1999 | Yoneda et al. |
| 6,258,156 | B1 | | 7/2001 | Azzopardi et al. ...... 106/287.14 |
| 6,299,721 | B1 | | 10/2001 | Poutasse et al. ............. 156/278 |
| 6,589,381 | B2 | * | 7/2003 | Poutasse et al. ............. 156/278 |
| 6,673,471 | B2 | * | 1/2004 | Steiner ....................... 428/652 |

FOREIGN PATENT DOCUMENTS

| EP | 700238 | 6/1996 |
| EP | 716164 | 6/1996 |
| GB | 2288992 | 11/1995 |
| JP | 01-149866 | 6/1989 |
| JP | 6-053651 | 2/1994 |
| JP | 06-085417 | 3/1994 |
| JP | 06-085455 | 3/1994 |
| JP | 6-177536 | 6/1994 |
| JP | 7-258870 | 10/1995 |
| JP | 7-309846 | 11/1995 |
| JP | 8-088461 | 4/1996 |
| JP | 7-278883 | 10/1996 |
| JP | 10-135202 | 4/1998 |
| RU | 1142526 | 2/1985 |
| WO | 96/25838 | 8/1996 |
| WO | 96/36747 | 11/1996 |
| WO | 98/20395 | 5/1998 |
| WO | 00/04749 | 1/2000 |

OTHER PUBLICATIONS

C2C Lamination Foil, website pages, Printed Oct. 31, 2000.
"Pushing the Envelope" Product Information Sheet, Copper to Copper North America (undated).
Appelt and Druschke, "Improving Adhesion Between Metal Surfaces and Polymers," IBM Technical Disclosure Bulletin, vol. 25, No. 6, 11–1982 (156/326).
European Patent Office Official Action, Application No. 99310013.0–2214, dated Dec. 27, 2002.
Japanese Patent Office Official Action, Application No. 11–338706, dated Mar. 21, 2001.

* cited by examiner

Primary Examiner—Philip C. Tucker
Assistant Examiner—Michael J Feely
(74) Attorney, Agent, or Firm—Renner, Otto, Boisselle & Sklar, LLP

(57) ABSTRACT

In one embodiment, the present invention relates to a composite article, comprising a metal foil having a first side and a second side; a protective film of at least one inert silane, titanate or zirconate overlying the first side of the metal foil; and a metal sheet having a first side and a second side, the first side overlying the protective film. In another embodiment, the present invention relates to a method of increasing tarnish resistance of metal foil comprising contacting the metal foil with an inert silane, titanate or zirconate compound to form a protective film having a thickness from about 0.001 microns to about 1 micron on a surface of the metal foil; and attaching the foil to a metal sheet.

23 Claims, 4 Drawing Sheets

US 6,805,964 B2

PROTECTIVE COATINGS FOR IMPROVED TARNISH RESISTANCE IN METAL FOILS

CROSS-REFERENCE TO RELATED APPLICATIONS

The present application is a division of U.S. application Ser. No. 09/714,811, filed Nov. 15, 2000, now U.S. Pat. No. 6,537,675, which is a continuation-in-part of U.S. application. Ser. No. 09/211,283, filed Dec. 14, 1998, and entitled "COATINGS FOR IMPROVED RESIN DUST RESISTANCE", now U.S. Pat. No. 6,299,721.

TECHNICAL FIELD

The present invention relates to a composite article and a method for treating metal foil to prevent or avoid tarnish of the surface of the metal foil. In particular, the present invention relates to a method of forming the composite article including treating the metal foil with an inert silane, titanate or zirconate compound to form a protective film which improves the metal foil's resistance to tarnish when the metal foil is attached or held adjacent to a metal sheet comprising a different metal.

BACKGROUND OF THE INVENTION

Copper clad laminates are the basic component of the printed circuit boards used in the electronics industry. In the most common processes, a copper foil is bonded to a prepreg of resin, such as epoxy resin, which has been impregnated into fiberglass by heat and pressure. The copper foil surface that is pressed against the prepreg is typically an uneven or profiled surface with some kind of additional bonding treatment applied to insure that the laminate remains together under normal processing conditions.

The opposing foil surface (the surface not bonded to the prepreg) is typically a smooth surface with various treatments that are aimed at preventing oxidation of the foil and allowing solder wettability and adequate photoresist adhesion. Such coatings may include metals such as zinc or chromium or alloys thereof. A number of such metal treatments are disclosed in U.S. Pat. No. 5,908,544, which is incorporated herein by reference for its teachings with respect to such coatings.

The opposing foil surface is often placed against or attached to a metal sheet comprised of a metal other than the metal foil. Thus, the metal foil may be made of a first metal, such as copper, and the metal sheet may be made of a second metal, such as aluminum. Metal foils are typically very thin and need to be protected from indenting, scratching, bending and folding during shipping, storage and handling prior to and during the lamination of the foil to prepregs. Metal sheets, of a metal which is less expensive and may be discardable, are commonly used for the purpose of providing such protection. In addition, such metal sheets can provide for distribution of heat and pressure in lamination processes, and act as a separator-release plate, or separator sheet, during the lamination of metal foil-prepreg laminates into books, from which PCBs are formed. The metal sheets may be made of any metal, such as stainless steel or aluminum. Aluminum is widely used in the industry today, due to the facts that it is relatively inexpensive and it can be recycled, which facilitates discarding of the metal sheet subsequent to its use. Such metal sheets, and methods of using the sheets with metal foils such as copper foils, are disclosed in U.S. Pat. Nos. 4,875,283 and 5,153,050, and the progeny of each of these patents. The disclosures of both U.S. Pat. Nos. 4,875,283 and 5,153,050 are incorporated herein by reference for their teachings of the use of metal sheets and separator sheets with metal foils.

As disclosed in detail in U.S. Pat. No. 4,875,283, the method thereof makes laminated printed circuit boards of the type having outer conductive metallic layers and at least one inner dielectric layer containing heat curable resin. The metal sheets (referred to therein as "separator-release sheets") are formed of aluminum and are coated on both sides with a polymeric resin release material in order to avoid or prevent adhesion between the conductive metal layer, which is generally a metal foil, in particular a copper foil, and the metal sheet. In addition to aluminum as the metal of the metal sheets, other metals may be used for this purpose.

The process of making the laminated printed circuit boards disclosed in U.S. Pat. No. 4,875,283 involves assembling a multi-layer book of circuit boards, one on top of another, in a press lay-up. In the process described in U.S. Pat. No. 4,875,283, a metal sheet is placed in engagement with each outer metallic layer of the board, and the laid-up book is subjected to heat and pressure to cure the resin. Next, at least one of the cured boards is separated from the book with the metal separator sheet remaining in engagement with the outer metallic layer of the separated board. Subsequently, the board may be drilled with the metal sheet attached to form, e.g., conductor lead holes in the board. Thereafter, the metal sheet is removed. The metal sheets may serve to prevent the resin from contaminating adjacent boards in the curing process, and also serve as drill entry and drill backup material in the drilling process, as well as serving as separator sheets in the lamination process.

As described in U.S. Pat. No. 4,875,283, the metal sheets provide protection to the metal foil during the lamination process. In addition, the metal sheet may be used to provide such protection prior to such lamination, such as during processing and handling.

When the metal sheet is attached to a metal foil, such as a copper foil, for use other than the immediate lamination steps described in U.S. Pat. No. 4,875,283, the metal foil is attached with an adhesive, as described in U.S. Pat. No. 5,153,050. When the metal foil is copper foil, the metal sheet is aluminum and a single copper foil is attached to one side of the aluminum sheet, the article is referred to as "CA." When the metal foil is copper foil, the metal sheet is aluminum and a copper foil is attached to both sides of the aluminum sheet, the article is referred to as "CAC."

A problem which has been encountered in the use of metal sheets such as those of U.S. Pat. Nos. 4,875,283 and 5,153,050 with metal foils is tarnishing, oxidation and/or corrosion of the surface of the metal foil facing the metal sheet, which problem types are generally referred to herein simply as "tarnish" or "tarnishing."

Thus, a need exists in the art for metal foils which resist the formation of tarnish, oxidation and/or corrosion when in contact with metal sheets.

SUMMARY OF THE INVENTION

In one embodiment, the present invention relates to a composite article, comprising a metal foil having a first side and a second side; a protective film of at least one inert silane, titanate or zirconate overlying the first side of the metal foil; and a metal sheet having a first side and a second side, the first side overlying the protective film.

In another embodiment, the composite article further includes a prepreg laminated to the second side of the metal foil.

In one embodiment, the metal foil comprises copper. In one embodiment, the metal sheet comprises aluminum. In one embodiment, the protective film is formed from an inert silane. In one embodiment, the inert silane is propyltrimethoxysilane.

In another embodiment, the composite article further includes a second metal foil having a first side and a second side; a protective film formed of at least one inert silane, titanate or zirconate overlying the first side of the second metal foil; and the second side of the metal sheet overlying the protective film on the second metal foil.

In one embodiment, the first and second metal foils each include a first portion which is adjacent to the metal sheet and a second portion which extends beyond a periphery of the metal sheet. In one embodiment, the second portions of the first and second metal foils are attached to each other. In one embodiment, the first portions of the first and second metal foils are adjacent to, but are not attached to, the metal sheet.

In one embodiment, the present invention relates to an article for use in printed circuit board manufacture, comprising:

a metal sheet of a first metal;

a metal foil of a second metal different from the first metal, a first side of the metal foil attached to a side of the metal sheet, the first side of the metal foil having bonded thereto a protective film having a thickness from about 0.001 microns to about 1 micron on a surface of the metal foil, the protective film formed of an inert silane, titanate or zirconate compound.

In another embodiment, the present invention further relates to an article for use in printed circuit board manufacture, comprising:

a metal sheet of a first metal, the metal sheet having a length and width;

a pair of metal foils of a second metal different from the first metal, a first side of the metal foil adjacent a side of the metal sheet, the first side of the metal foil having bonded thereto a protective film having a thickness from about 0.001 microns to about 1 micron on a surface of the metal foil, the protective film formed of an inert silane, titanate or zirconate compound, wherein each of the pair of metal foils have a length and width greater than the length and width of the metal sheet and the pair of metal foils are adhered to each other.

In one embodiment, the present invention relates to a method of increasing tarnish resistance of a metal foil of a first metal attached to a metal sheet of a second metal, comprising:

contacting at least one side of the metal foil with an inert silane, titanate or zirconate compound to form a protective film having a thickness from about 0.001 microns to about 1 micron on a surface of the metal foil; and attaching a side of the metal foil having the protective film to the metal sheet.

In another embodiment, the present invention relates to a method of treating metal foil comprising a method of increasing tarnish resistance of metal foil comprising:

contacting the metal foil with an inert silane compound to form a protective film having a thickness from about 0.001 microns to about 1 micron on a surface of the metal foil.

In another embodiment, the present invention relates to a method of treating metal foil comprising:

contacting a first side of the metal foil with a hydrocarbylsilane solution to form a protective film on a surface of the metal foil, the hydrocarbylsilane solution comprising from about 0.01% to about 10% v/v of a hydrocarbylsilane;

attaching the first side to a metal sheet of a metal other than that of the metal foil; and laminating a second side of the metal foil to a prepreg.

In yet another embodiment, the present invention relates to a method of treating copper foil comprising a method of treating copper foil comprising:

contacting the copper foil with a solution comprising from about 0.05% to about 5% v/v of an alkyl silane;

attaching a first side of the copper foil to an aluminum sheet; and laminating the copper foil to an epoxy resin material.

With the present invention, it is possible to provide metal foil which exhibits high tarnish resistance when attached to a metal sheet made of a metal different from that of the metal foil. In particular, the present invention provides a protective coating for application to a metal foil surface that prevents tarnish from forming, particularly on the side of the metal foil which is adjacent a metal sheet and which is not adjacent a prepreg. Thus, a clean, tarnish-free metal foil surface remains after the metal foil has been attached to or held adjacent to, used with, e.g., in lamination, and subsequently detached from, a metal sheet made of a different metal.

DESCRIPTION OF THE INVENTION

Figure 1:
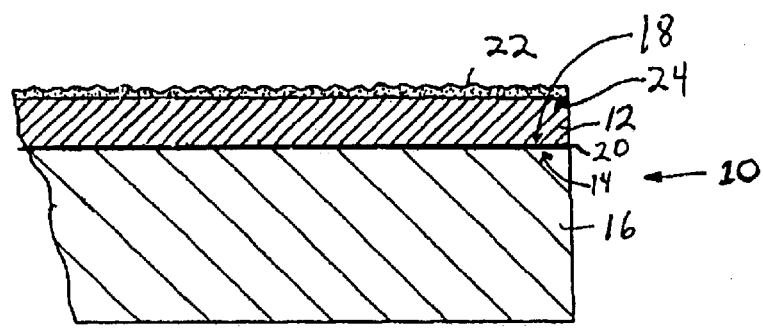
FIG. 1 is a schematic cross-sectional view of a single metal foil, treated with a protective film of an inert silane, attached to a metal sheet, in accordance with the present invention.

The present invention relates to treating metal foil by contacting the surface of a metal foil with an inert silane, titanate or zirconate compound to protect the metal foil by imparting tarnish resistance to the metal foil when the metal foil is attached to a metal sheet of a different metal. Such a foil/metal sheet article may be referred to as "FS"; when two metal foils are attached to a single metal sheet, the article may be referred to as "FSF"; and when two metal foils sandwich a metal sheet and the foils are attached to each other but not to the metal sheet, the article may be referred to as "F-to-F." When the "F" and "S" are, for example, a copper foil and an aluminum sheet, the article conveniently may be referred to as "CA", as "CAC" or as "C-to-C."

In one embodiment, the treatment by contacting the metal foil with an inert silane, titanate or zirconate provides increased tarnish resistance to the metal foil when the metal foil is attached to a metal sheet and subsequently laminated to, e.g., laminating materials such as prepreg materials. In one embodiment, inert silane compounds are used for the treatment. In one embodiment, the side of the metal foil which will face the metal sheet is treated (the side which will not be adjacent the prepreg). In one embodiment, both sides of the metal foil are so treated.

As used herein, the terms "tarnish" or "tarnishing" encompass formation of tarnish, oxidation and/or corrosion on the surface of the metal foil.

As used herein, the term "tarnish-resistant" means that the metal foil resists formation of tarnish during the period of time it is attached or held adjacent to the metal sheet, including, e.g., during storage, during lamination of the metal foil to prepregs, and during lamination of multiple laminates of metal foil and prepreg into multilayer PCBs known as "books."

As used herein, the term "protective film" refers to a film formed from an inert silane, titanate or zirconate compound in accordance with the present invention. The protective film disclosed herein provides tarnish resistance to a metal foil to which the protective film is applied.

As used herein, the term "overlies" and cognate terms such as "overlying" and the like, when referring to the relationship of one or a first layer relative to another or a second layer, refers to the fact that the first layer partially or completely lies over the second layer. The first layer overlying the second layer may or may not be in contact with the second layer. For example, one or more additional layers may be positioned between the first layer and the second layer. The term "underlies" and cognate terms such as "underlying" and the like have similar meanings except that the first layer partially or completely lies under, rather than over, the second layer.

As used herein, an inert silane, titanate or zirconate compound is one which includes a polar, reactive portion and an essentially inert, non-reactive hydrophobic portion. The reactive portion of the inert silane, titanate or zirconate compound, upon application to a metal substrate bonds to or combines with the metal substrate, and leaves the inert, non-polar hydrophobic portion of the molecule exposed. Thus, the inert silane, titanate or zirconate compound includes a polar, reactive portion which reacts and/or combines with the surface of the metal foil and thereby provides an attachment to the foil for the inert, non-polar hydrophobic portion which faces away from the metal foil.

As used herein, the term "metal sheet" refers to a sheet of metal which may be attached to, in contact with, adjacent to or otherwise associated with one or more metal foils. The metal sheet may act as a support or carrier for the metal foil, and, during a lamination step, may also act as a separator sheet or as a separator/release sheet, as those terms are known and used in the metal foil lamination arts. The metal sheet generally may be a metal which is different from a metal of the associated metal foil.

Tarnish typically appears after lamination of the metal foil to laminating materials, such as epoxy resin materials, polyimide resin materials, and polyester resin materials. However, tarnish may appear after extended storage, shipping or any exposure of the foil to elevated temperatures, when attached to a metal sheet of a different metal. As discussed above, tarnish is a particular problem when the metal foil is attached or held adjacent to a metal sheet. Usually the tarnish is observed on the side of the metal foil facing the metal sheet, since the other side of the foil may already be bonded to and/or coated with the laminating materials which coat or bond to this surface and thus protect it from the environment. However, the tarnish may also be observed on the side of the metal foil facing away from the metal sheet. In the absence of the inventive treatment, the tarnish occurs particularly in metal foils, such as copper, attached to metal sheets made of relatively more active metals, such as aluminum. Treating metal foil by contacting the surface of a metal foil with an inert silane, titanate or zirconate compound in accordance with the present invention forms a protective film or layer on the metal foil surface which resists tarnish resulting from the foil being attached to a metal sheet of a metal other than the metal of the metal foil.

Attachment of Metal Foil to Metal Sheet

Referring now to the drawing figures, as shown therein, in each embodiment of the present invention, the metal foil is first treated with, and includes a protective film or layer of, the inert silane, titanate or zirconate of the present invention so as to provide the metal foil with improved resistance to tarnish, such as that which has been observed to result from the attachment to the metal sheet in the absence of such treatment. In the drawing figures, like parts are given like reference numbers in each figure.

First Embodiment

FIG. 1 is a schematic cross-sectional view of an embodiment in which a single metal foil, treated with a tarnish resistance-imparting inert silane to form a protective layer or film, is attached to a metal sheet, in accordance with the present invention. In the embodiment illustrated in FIG. 1, the article is designated "FS," since a single metal foil is attached to a metal sheet. In an embodiment in which the metal foil is copper foil, the metal sheet is aluminum and the single copper foil is attached to one side of the aluminum sheet, the article is referred to as "CA."

As shown in FIG. 1, in this embodiment, an article 10 comprises a single sheet of a metal foil 12 which is adhered to a first side 14 of a metal sheet 16, to form the "FS" article 10. A first surface 18 of the metal foil 12 has been treated with, and the FS article 10 includes a protective layer 20 of, an inert silane. As shown in FIG. 1, the metal foil 12 may include an optional treatment layer 22 on the second surface 24 thereof, i.e., the second surface 24 is opposite to the first surface 18 which has been treated with the inert silane to form the protective layer 20 and attached to the metal sheet 16. The metal foil 12 with the protective layer 20 may be attached to the metal sheet 16 by an adhesive (not shown in FIG. 1). As noted above, when the metal foil 12 is copper, and the metal sheet 16 is aluminum, the article 10 may be referred to as a CA article. The metal sheet 16 may be treated with a release material (not shown) prior to attachment to the metal foil.

Second Embodiment

Figure 2:
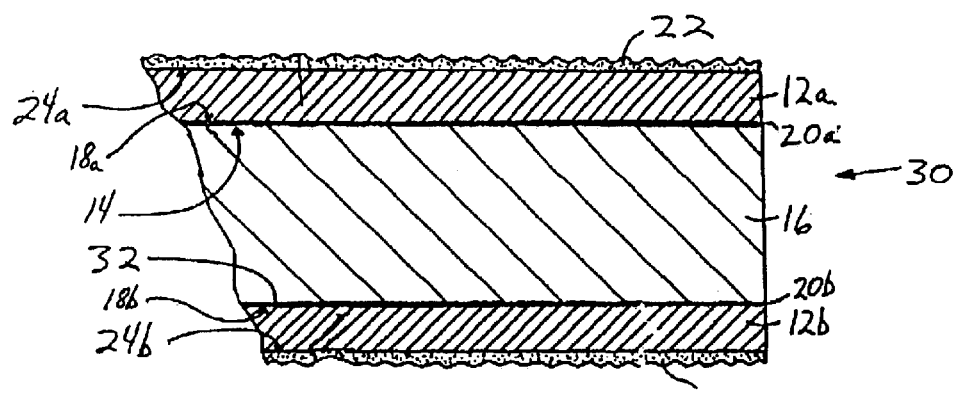
FIG. 2 is a schematic cross-sectional view of two metal foils, each treated with a protective film of an inert silane, attached to a metal sheet, in accordance with the present invention.

FIG. 2 is a schematic cross-sectional view of an embodiment in which two metal foils, each treated with a tarnish resistance-imparting inert silane to form respective protective layers or films, are attached to opposite sides of a metal sheet, in accordance with the present invention, to form an article referred to generally as "FSF." In an embodiment in which the metal foil is copper foil, the metal sheet is aluminum and two copper foil are attached to opposite sides of the aluminum sheet, the article is referred to as "CAC."

As shown in FIG. 2, a composite article 30 comprises two sheets of a metal foil 12a and 12b, each of which are adhered to opposite surfaces 14 and 32 of a single metal sheet 16, to form the "FSF" article 30. A first surface 18a and 18b of each respective metal foil 12a and 12b has been treated with, and the FSF article 30 thus includes two protective layers 20a and 20b of an inert silane. As shown in FIG. 2, each metal foil 12a and 12b may include an optional treatment layer 22 on respective second surfaces 24a and 24b, i.e., the surfaces of each metal foil opposite to the first surface which has been treated with an inert silane and which will be attached to the metal sheet 16. The metal foils 12a and 12b, each with the respective protective layer 20a and 20b, may be attached to the metal sheet 16 by an adhesive (not shown in FIG. 2). As noted above, when each metal foil 12a and 12b is copper, and the metal sheet 16 is aluminum, the article 30 may be referred to as a CAC article. The metal sheet 16 may be treated with a release material (not shown) prior to attachment to the metal foil.

Figure 3:
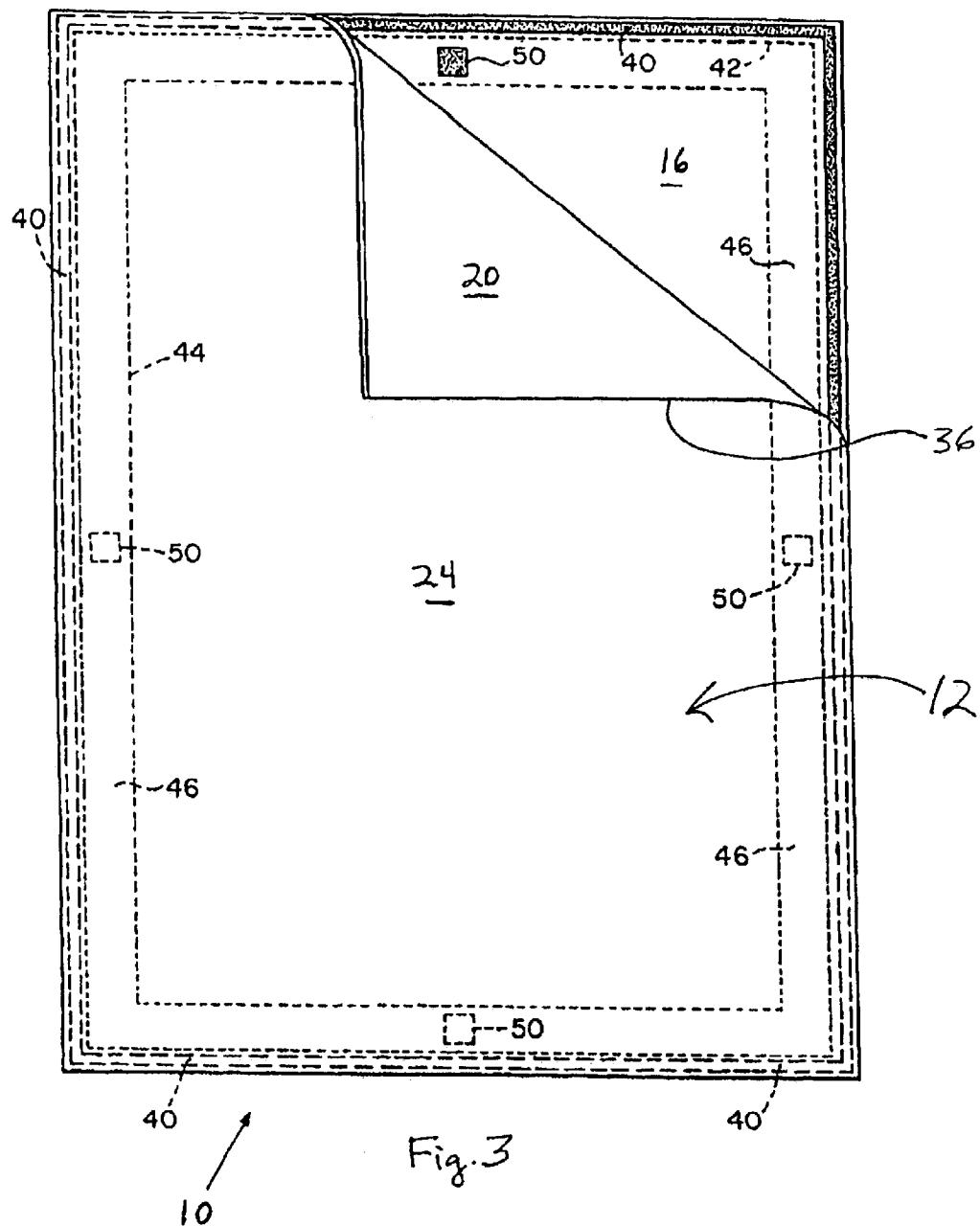
FIG. 3 is a schematic plan view of a partially peeled-back metal foil, treated with a protective film of an inert silane, attached to a metal sheet, in accordance with the present invention.

FIG. 3 is a schematic plan view of a composite article which may be an FS article or an FSF article. In FIG. 3, the article is designated as the FS article 10 described above and shown in FIG. 1, (it is understood that a similar view would appear of, and a similar description would apply to, the FSF article of FIG. 2). In the article 10 shown in FIG. 3, the metal foil 12 is shown partially peeled back. The metal foil 12 has been treated with, and includes a protective layer 20 of a tarnish resistance-imparting inert silane. The metal foil 12 has been attached to a metal sheet 16, in accordance with the present invention. As shown in FIG. 3, the FS article 10 is viewed with the second surface 24 of the metal foil 12 (which has not been treated with the inert silane of the present invention) facing upwardly and peeled back at one corner 36. The peeled-back corner 36 of the metal foil 12 exposes the protective layer 20 on the metal foil 12 which has been formed by treatment of the metal foil 12 with an inert silane, titanate or zirconate in accordance with the present invention. The metal foil 12 as shown in FIG. 3 does not include a treatment layer 22, but such may of course be included.

As described in more detail above, the FS component shown in FIG. 3 may include a metal sheet of aluminum which may be, for example, from about 1 mil (0.025 mm) to about 25 mils (0.63 mm) in thickness. Similarly, the metal foil attached to the metal sheet may be, for example, ½ oz. copper foil, i.e., about 0.7 mil (0.018 mm) in thickness.

As shown in FIG. 3, a band of flexible adhesive 40 extends around the periphery of the FS article 10 near or at the outer edge of the article (the flexible adhesive 40 is shown in phantom in the portions of the article in which the metal foil is not folded back). The band of flexible adhesive 40 is located in an adhesive application zone defined by the dotted line 42 and the edge of the FS article 10. In this embodiment, the flexible adhesive attaches the metal foil 12 to the metal sheet 16. The adhesive 40 may be applied to the protective layer 20 or to the surface of the metal sheet 16 at the respective borders of the metal foil 12 and the metal sheet 16. The central zones of the metal foil 12 and the metal sheet 16, inside a border line 44, are not attached to each other, but are normally in contact with each other. Generally, it is this adjacent but non-attached central zone inside the border 44 of the metal foil 12 which may become tarnished in the absence of treatment with the inert silane in accordance with the present invention.

The flexible adhesive band 40 may be applied in the adhesive application zone 42 in a width from about 0.01 to about 0.5 inches (about 0.25 mm to about 12.5 mm) depending upon both the end product requirements and the size of the sheets of aluminum and copper being used. In one embodiment, the flexible adhesive band 40 is from about 0.030 inch (0.75 mm) to about 0.090 inch (2.3 mm) in width.

In one embodiment, the flexible adhesive band 40 is from about 0.001 inch (0.025 mm) to about 0.005 inch (0.125 mm) in thickness. In one embodiment, the flexible adhesive band 40 is from about 0.001 inch (0.025 mm) to about 0.002 inch (0.05 mm) in thickness. The amount and thickness of the adhesive should be sufficient to maintain the metal foil in position on the metal sheet during the steps in which the article is processed.

The adhesive may be any flexible adhesive. The exact nature of the adhesive is not critical, however, it should be capable of adhering to the inert silane and to any release material applied to the metal sheet. The portion of the foil comprising the application zone 42 may be cut away from the remaining portions subsequently in the processing to form, e.g., PCBs.

As shown in FIG. 3, the central non-joined zone defined by the border 44 spaced inwardly from the adhesive application zone 42 is designed to form the finished circuit board. In addition to the adhesive 40, in one embodiment additional spots 50 of adhesive are included in a band 46 which lies outwardly from the central zone border line 44 and inwardly of the adhesive application zone line 42. Portions of the band 46 may be used, e.g., for making test portions of small boards for quality control purposes. The additional spots 50 of adhesive may comprise the same or a different adhesive as that used for the flexible adhesive 40.

In the embodiments shown in FIGS. 1–3, surface(s) of the metal sheet to which the metal foil(s) will be attached may be clean, i.e., virgin metal untreated in any way other than cleaning, such as degreasing and/or washing. The metal sheet 16 may be treated with a release material. The release material may be a polymeric resin initially applied, for example, by a spraying process which deposits a coating of release material from about 1 to about 5 microns in thickness on the metal sheet 16. If the release material is applied from a solution, in the drying and curing process, solvent in the release material flashes off, leaving the coating. The polymeric resin may be one of a number of resins which are thermally stable to approximately 375° C. Exemplary polymeric resins are disclosed in U.S. Pat. No. 4,875,283, which is incorporated herein by reference for its teachings of such release materials. In one embodiment, the release material is a silicon-containing polymerizable resin sold under the trade name FREKOTE® 700 or FREKOTE® 700-NC by FREKOTE, Inc., a subsidiary of the Dexter Corporation of Seabrook, N.H. The release material applied to the metal sheet provides for easier separation of the metal foil from the metal separator sheet after lamination.

A standard size sheet of copper foil employed in making PC boards today is 12×12 inches. Another standard size is 18×24 inches. Sheets as large as 48×72 are sometimes used. Sheets 36×48 inches may be cut into four separate sheets of 18×24 inches. Other in-between sizes may be used as well.

Third Embodiment

In a third embodiment, the invention relates to an article for use in printed circuit board manufacture, including a metal sheet of a first metal, the metal sheet having a length and width; a pair of metal foils, both formed of a second metal which is different from the first metal. In this embodiment, a first side of each metal foil is adjacent a side of the metal sheet, and this first side of the metal foil has bonded thereto a protective film. The protective film may have a thickness from about 0.001 microns to about 1 micron. The protective film is formed of an inert silane, titanate or zirconate compound. In this embodiment, each of the pair of metal foils has a length and width greater than the length and width of the metal sheet, and the pair of metal foils are adhered to each other in the areas of each metal foil which extend beyond the periphery of the metal sheet. Except as noted, the metal foil and the metal sheet of this embodiment may be essentially the same as described above with respect to the first (FS) and second (FSF) embodiments.

The composite article of the third embodiment may be made by a method in which metal foils of any particular type and thickness described herein are joined to a metal sheet of any particular type of alloy and thickness described herein, such that the edges of the metal foils extend beyond the edges of the metal sheet, the metal foil edges are attached to each other, and the metal foil is adjacent to but is not directly attached to the metal sheet by any means. Such an assembly simplifies later assembly of multilayer press packets or books.

In this embodiment, the pair of metal foils are placed on both sides of the metal sheet. The metal foils are attached to each other in a region outside the useful surface of the metal foil. This arrangement allows for thermal expansion of the metal sheet with no danger of wrinkling, stretching or otherwise deforming the metal foil. This arrangement may be referred to as a foil-to-foil article, or, using the above nomenclature, a F-to-F article. Thus, for example, in the case of copper foils, the article would be a copper-to-copper article, i.e., a C-to-C article. While not specifically identified in this designation, the F-to-F and C-to-C composite articles each include a metal sheet sandwiched between the pair of metal foils.

The metal foils may be attached to each other by a suitable adhesive, by welding, by soldering, or by any other means for attaching a pair of metal foils to each other. Since the attached portions of the metal foil in a foil-to-foil article are intended to be discarded, the attachment material or means for attaching the foils is not critical to the invention.

Figure 4:
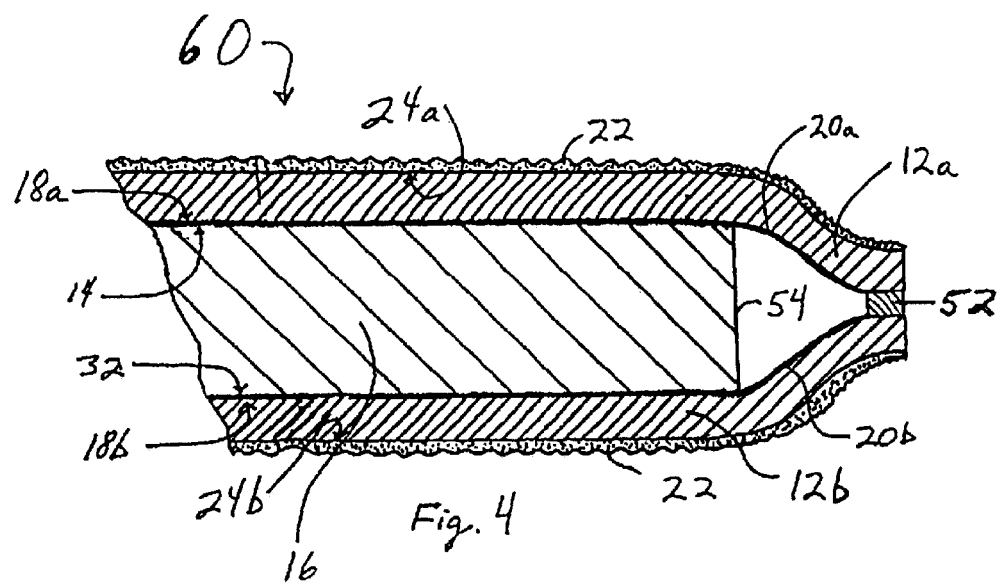
FIG. 4 is a schematic cross-sectional view of two metal foils, each treated with a protective film of an inert silane, attached to a metal sheet, in which the metal foils are larger than the metal sheet and are attached to each other, in accordance with the present invention.

FIG. 4 is a schematic cross-sectional view of an embodiment in which two metal foils, each treated with a tarnish resistance-imparting inert silane to form a protective layer or film, are attached to opposite sides of a metal sheet, in accordance with the present invention, to form an article referred to generally as "F-to-F." In an embodiment in which the metal foil is copper foil, the metal sheet is aluminum and two copper foils are attached to each other opposite sides of the aluminum sheet, the article is referred to as "C-to-C." The reference numbers used in FIG. 4 are the same as in FIGS. 1 and 2 where the identified elements are the same.

As shown in FIG. 4, a composite article 60 comprises two sheets of a metal foil 12a and 12b, each of which are held adjacent to opposite surfaces 14 and 32 of a single metal sheet 16, to form the "F-to-F" article 60. A first surface 18a and 18b of each respective metal foil 12a and 12b has been treated with, and the F-to-F article 60 thus includes two protective layers 20a and 20b of an inert silane, titanate or zirconate in accordance the present invention. As shown in FIG. 4, each metal foil 12a and 12b may include an optional treatment layer 22 on respective second surfaces 24a and 24b, i.e., the surfaces of each metal foil opposite to the first surface which has been treated with an inert silane and which will be attached to the metal sheet 16. The metal foils 12a and 12b, each with the respective protective layer 20a and 20b, are adjacent, but not attached to, the metal sheet 16. The metal foils 12a and 12b are attached to each other by an attachment material 52 at a portion of each foil which extends beyond a periphery 54 of the metal sheet 16. The attachment material 52 may be an adhesive, a weld, a soldering or other known attachment materials or means for attaching together metal foils, e.g., a chemical bond. The adhesive, for example, may be a thermoplastic adhesive or a thermosetting adhesive. The adhesive may be an epoxy or a polyacrylate or polymethacrylate. The weld may be by any standard weld useful for metal foils. The soldering may be by any standard solder useful for metal foils. In one embodiment, the solder is free of added lead. The exact nature of the attachment material is not critical.

The portions of the metal foils 12a and 12b extending beyond the periphery 54 of the metal sheet 16 may be removed and the metal foil recycled subsequent to lamination of the article.

Figure 5:
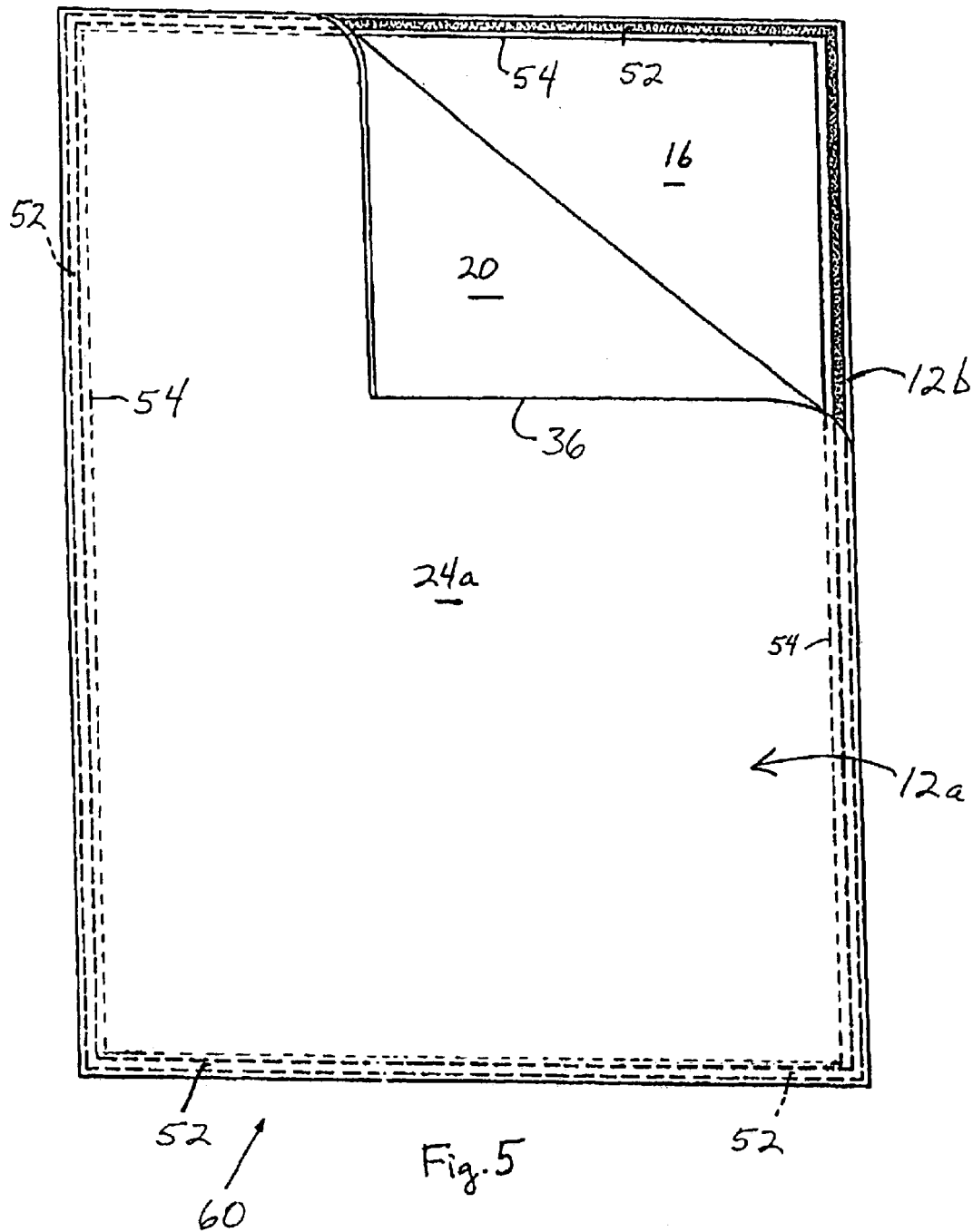
FIG. 5 is a schematic plan view of a partially peeled-back metal foil, treated with a protective film of an inert silane, attached to a metal sheet, in which the metal foil and a second metal foil are larger than the metal sheet and are attached to each other, in accordance with the present invention.

FIG. 5 is a schematic plan view of the F-to-F composite article 60, in accordance with this embodiment of the present invention. In FIG. 5, the article 60 is shown with the metal foil 12a partially peeled-back. The article 60 further includes a second metal foil 12b. Both of the metal foils 12a and 12b have been treated with, and each includes a protective layer 20 of a tarnish resistance-imparting, inert silane, titanate or zirconate. The metal foils 12a and 12b have been placed adjacent to a metal sheet 16, in accordance with the present embodiment. As shown in FIG. 5, the F-to-F article 60 is viewed with the second surface 24a of the metal foil 12a (which second surface 24a has not been treated with the inert silane of the present invention) facing upwardly and peeled back at one corner 36. The peeled-back corner 36 of the metal foil 12a exposes the protective layer 20 on the metal foil 12a which has been formed by treatment of the metal foil 12a with an inert silane, titanate or zirconate in accordance with the present invention, and allows an edge portion of the metal foil 12b to be seen in the view shown in FIG. 5. The copper foil 12a as shown in FIG. 5 does not include a treatment layer 22, but such may of course be included, as shown in FIG. 4.

As described in more detail above, the F-to-F component shown in FIG. 5 may include a metal sheet of commercial grade aluminum which may be, for example, from about 1 mil (0.025 mm) to about 25 mils (0.63 mm)in thickness. Similarly, the metal foil attached to the metal sheet may be, for example, ½ oz. copper foil, i.e., about 0.7 mil (0.018 mm) in thickness.

As shown in FIG. 5, a band of the attachment material 52 extends around the periphery 54 of the F-to-F article 60 near the edge of the copper article where the metal foils extend beyond the periphery 54 of the metal sheet 16 (the attachment material 52 is shown in phantom in the portions of the article in which the metal foil is not folded back). The attachment material 52 attaches the first metal foil 12a to the second metal foil 12b, but not to the metal sheet 16. The attachment material 52 is applied to the protective layer 20 of either or both of the metal foils 12a and 12b, in the portion of the metal foil 12a and/or the metal foil 12b. The central zones of the metal foils 12a and 12b are not attached to the metal sheet 16, but are adjacent to and are normally in contact with the metal sheet. Generally, it is this adjacent but non-attached area of the metal foils 12a and 12b which may become tarnished in the absence of treatment with the inert silane in accordance with the present invention.

As shown in FIG. 5, the band of attachment material 52 may have a width from about 10 mils to about 500 mils (about 0.25 mm to about 12.5 mm) depending upon both the end product requirements and the size of the sheets of aluminum and copper being used. In one embodiment, an adhesive band or strip having a width from about 30 mils (0.75 mm) to about 90 mils (2.3 mm) is used. In one embodiment, the band of attachment material 52 may have a thickness from about 1 mil (0.025 mm) to about 5 mils (0.125 mm). In one embodiment, the band of attachment material 52 has a thickness from about 1 mil (0.025 mm) to about 2 mils (0.05 mm).

As shown in FIG. 5, the central non-attached zone is defined by an outer periphery 54 of the metal sheet 16 (the outer periphery 54 is shown in phantom in the portions of the article in which the metal foil is not folded back). This central, non-attached zone will be incorporated in the finished circuit board. The attached portion of the metal foils 12a and 12b, and the portion of these foils which extend beyond the periphery 54 of the metal sheet 16 will be cut off and discarded.

When a plurality of the F-to-F articles comprising the pair of metal foils and the metal sheet are clamped together and placed in the multiarticle press together with epoxy resin fabric for multilayer pressing to form "books" for use as multilayer PCBs, the metal of the metal sheet can expand in an unrestricted manner during heating without causing the occurrence of surface tensions on and resultant deformations in the metal foil. Thus, when the epoxy resin softens and flows, it can flow along the metal foil and bond thereto without coming into contact with the metal sheet and without possibly contacting the edges of the multilayer with epoxy. The attached portions of the metal foils, which extend beyond the periphery of the metal sheet, can then be easily separated along the metal sheet.

In the F-to-F embodiment, the metal foil may be somewhat larger than a standard metal foil (as described above), in order to provide the portion which extends beyond the outer periphery of the metal sheet. Thus, for example, rather than a sheet of metal foil having a dimension of 12 inches× 12 inches, the sheet may have a dimension of 13 inches×13 inches.

In the absence of the protective layer formed by the tarnish resistance-imparting inert silane treatment of the present invention, during the time the metal foil, of a first metal, is attached to the metal sheet, of a second metal, the metal foil may become tarnished. The tarnish may form during, and may not become apparent until after, lamination to a prepreg, during which time intense heat and pressure are applied to the nascent laminate, generally in the presence of moisture and/or reactive chemical species which may be present as by-products of chemical reactions during the lamination or as impurities in the laminate reactants.

In one embodiment, the inventive method involves contacting the surface of a treated or untreated metal foil, opposite the surface of which is or will be laminated to a resin material such as an epoxy prepreg, with an inert silane, titanate or zirconate compound, and subsequently attaching the treated surface to a metal sheet of a metal other than the metal of the metal foil. In one embodiment, the surface of a metal foil is treated in accordance with the present invention prior to lamination of the opposite side to a resin material. In another embodiment, the surface of a metal foil is treated in accordance with the present invention after lamination of the opposite side to a resin material. In one embodiment, both sides of the metal foil are treated prior to lamination or attachment of the metal foil to the metal sheet. The present invention is especially beneficial when the metal foil is treated on both sides prior to attachment to the metal sheet and prior to lamination to a resin or prepreg material.

Metal Foils

The metal foil 12 treated in accordance with the present invention may be any metal foil that can be laminated with a resin based material, such as an epoxy prepreg. Such metal foils, when laminated to a prepreg may be used in the manufacture of printed circuit boards (PCBs). In one embodiment, the metal foil treated in accordance with the present invention is an electrically conductive metal foil. In one embodiment, the metal foil may comprise copper, aluminum, nickel, tin, silver, gold, chromium, zinc, platinum, palladium, iron, lead, steel, brass, bronze, or an alloy of two or more of the foregoing metals. In one embodiment, the metal foil is copper. In one embodiment, the metal foil is a copper-based alloy. Examples of such alloys include copper-zinc, copper-silver, copper-tin, chromium-molybdenum and nickel-chromium.

The metal foil 12 may be made using any suitable method. Typically, the metal foil is made using one of two techniques. In one embodiment, the foil is a wrought or rolled metal foil, such as copper foil, which is produced by mechanically reducing the thickness of a metal or metal alloy strip or ingot by a process such as rolling. In one embodiment, the foil is an electrodeposited foil, which is produced by electrolytically depositing metal ions, such as copper ions, on a rotating cathode drum and then peeling the deposited metal strip from the cathode. In one embodiment, the metal foil is an electrodeposited copper foil.

The metal foil 12 typically has a nominal thickness ranging from about 0.2 mils (about 0.005 mm) to about 200 mils (about 2.5 mm). In one embodiment, the metal foil has a nominal thickness in the range from about 2 mils (0.5 mm) to about 30 mils (0.76 mm). In one embodiment, the metal foil has a nominal thickness in the range from about 2 mils (0.5 mm) to about 15 mils (0.38 mm). In one embodiment, the metal foil has a nominal thickness in the range from about 6 mils (0.15 mm) to about 15 mils (0.38 mm). Metal foil thickness is sometimes expressed in terms weight and typically the foils of the present invention have weights or thicknesses ranging from, for example, about ⅛ to about 14 oz/ft$^2$ (about 38 g/m$^2$ to about 4280 g/m$^2$). In one embodiment, the metal foil is a copper foil having a weight of ½, 1, 2 or 3 oz/ft$^2$ (about 153, 306, 611 or 917 g/m$^2$, respectively). In one embodiment, the metal foil is a copper foil having a weight of 1 oz/ft$^2$ (306 g/m$^2$). In one embodiment, the metal foil is a copper foil having a weight of 2 oz/ft$^2$ (611 g/m$^2$).

Electrodeposited metal foils have a smooth or shiny (drum) side and a rough or matte (metal deposit growth front) side. The side or sides of the metal foil which may be contacted with an inert silane, titanate or zirconate in accordance with the invention can be the rough or matte side, shiny side, or both sides. In accordance with one embodiment of the invention, a metal foil may have its shiny side treated. In one embodiment, a metal foil has its matte side treated. In one embodiment, a metal foil has both matte and shiny sides treated.

The sides of the metal foil 12 may be a "standard-profile surface," "low-profile surface" or "very-low-profile surface." These terms may be applied to both the matte surface and the shiny surface of the metal foils. The term "standard-profile surface" is used herein to refer to a foil surface having an $R_{tm}$ of about 7 microns to about 18 microns. The term "low-profile surface" refers to a foil surface having an $R_{tm}$ of about 4 to about 7 microns. The term "very-low-profile surface" refers to a foil surface having an $R_{tm}$ of about 1 to about 4 microns. $R_{tm}$ is the mean of the maximum peak-to-valley vertical measurement from each of five consecutive sampling measurements, and can be measured using a Surtronic 3 profilometer marketed by Rank Taylor Hobson, Ltd., Leicester, England.

In one embodiment, the metal foil 12 of the present invention may be characterized by the absence of any added surface roughening treatment on the base surface of the side or sides opposite to which the inventive method is practiced. The term "base surface" of a side of foil refers to a raw foil surface which has not been subjected to any subsequent treatments of the type discussed below for refining or enhancing foil properties and/or increasing surface roughness. The term "added surface roughening" refers to any treatment performed on the base surface of the foil for the purpose of increasing the roughness of the surface of the foil not in accordance with the inventive method. In one embodiment, added surface roughening increases the $R_{tm}$ by 3 microns or more; and in another embodiment, added surface roughening increases the $R_{tm}$ by 10 microns or more.

In one embodiment, mechanical roughness imparted to wrought metal foil during rolling or by subsequent abrasion which increases roughness beyond that of a standard profile surface is considered to be an added surface roughening treatment. In one embodiment, roughness imparted to an electrodeposited metal foil during electrodeposition which increases roughness beyond that of a standard profile surface is considered to be an added surface roughening. In one embodiment, any roughness imparted to the base surface of a metal foil that increases the roughness of the foil beyond that of a standard profile surface is considered to be added surface roughening. In one embodiment, any roughness imparted to the base surface of a metal foil that increases the roughness of the foil beyond that of a low-profile surface is considered to be added surface roughening. In one embodiment, any roughness imparted to the base surface of a metal foil that increases the roughness of the foil beyond that of a very low-profile surface is considered to be added surface roughening. The surface roughening may comprise, e.g., forming dendrites on the shiny side of electrodeposited foil.

In one embodiment, the base surface of the side or sides of the metal foil is untreated prior to being subjected to the inventive method. The term "untreated" is used herein to refer to the base surface of a metal foil that has not undergone subsequent treatment for the purpose of refining or enhancing the foil properties and/or increasing surface roughness. In one embodiment, the untreated foils have a naturally occurring, non-dendritic or non-nodular layer of a metal oxide adhered to the base surface thereof. This naturally occurring oxide layer is not an added treatment provided for refining or enhancing foil properties and/or increasing surface roughness.

Surface Treatments of the Metal Foil

In one embodiment, the base surface of the side or sides of the foil 12 is treated, prior to being subjected to the inventive method, with one or more surface treatment layers for the purpose of refining or enhancing the foil properties, but not to add surface roughness. Any side of the foil which is not subjected to the inventive method can, optionally, also have one or more of such treatment layers applied to it. These surface treatments are known in the art.

For example, the surface treatments include the application of a metal layer 22 which does not increase the surface roughness wherein the metal is indium, tin, nickel, cobalt, copper alloy such as copper-tin alloy, and mixtures of two or more thereof, prior to practicing the inventive method. Metal layers of this type are sometimes referred to as barrier layers. These metal layers preferably have thicknesses in the range of about 0.01 to about 1 micron, more preferably about 0.05 to about 0.1 micron.

The surface treatments also include the application of a metal layer 22 which does not increase the surface roughness, wherein the applied metal layer comprises tin, nickel, molybdenum, chromium, chromium-zinc, zinc, aluminum, or a mixture of two or more thereof, prior to practicing the inventive method. Metal layers of this type are sometimes referred to as stabilization layers. These stabilization layers can be applied to the base surface of the foil, or they can be applied to a previously applied barrier layer. In one embodiment, the stabilization layer has a thickness in the range of about 0.005 to about 0.05 micron. In one embodiment, the stabilization layer has a thickness in the range from about 0.01 to about 0.02 micron. The metals applied as a surface treatment may include metals in a metallic, metal oxide or metal nitride form. The metals may be applied by known methods, e.g., by electrodeposition or by a vapor deposition method. Examples of such metals and methods for application thereof are disclosed, e.g., in U.S. Pat. No. 5,908,544.

In one embodiment, one or both sides of the metal foil 12 is first treated with at least one barrier layer to form the layer 22. In another embodiment, one or both sides of the foil is first treated with at least one stabilization layer. In yet another embodiment, one or both sides of the foil is first treated with at least one barrier layer, then at least one of the treated sides is treated with at least one stabilization layer prior to practicing the inventive method.

The metal foil 12 in accordance with this invention can be a single layer metal foil, such as a copper foil, an aluminum foil or a nickel foil, or a foil of a metal alloy. The metal foil in accordance with this invention can be a foil containing multiple layers of a metal or metal alloy, such as a foil made of layers of copper and brass. There is no particular limit to the number of metal layers in any given metal foil.

In one embodiment, the inventive process optionally involves initially contacting the metal foil 12 with an acidic solution. An acidic solution has a pH of less than about 5, and preferably less than about 3, and more preferably less than about 2. The acidic solution contains an acid and a solvent such as water, polar organic liquids such as alcohols and glycols, and mixtures thereof. Contacting the metal foil with the acidic solution serves to remove surface oxides from the metal foil and otherwise clean the surface of the metal foil. Additionally, in some instances, contact with the acidic solution before application of the inert silane, titanate or zirconate compound facilitates the inventive treatment.

The metal foil is contacted with the acidic solution in any suitable manner including but not limited to dipping, spraying, wiping, immersing and the like. In one embodiment, the metal foil is immersed in the acidic solution. In another embodiment, the temperature of the acidic solution is from about 20° C. to about 60° C. In one embodiment, the temperature of the acidic solution is from about 30° C. to about 40° C.

The acidic solution contains an acid and a suitable solvent. In one embodiment, the solvent is water. In one embodiment, polar organic liquids are used as the solvent. In one embodiment, combinations of water and polar organics are used as the solvent. In one embodiment, inorganic acids are used. In one embodiment, organic acids are used.

Examples of inorganic acids which may be utilized in the acidic solution include halogen acids such as hydrofluoric acid, hydrochloric acid, hydrobromic acid and hydriodic acid, sulfuric acid, sulfurous acid, nitric acid, perchloric acid, boric acid and phosphorus acids such as phosphorous acid and phosphoric acid, and combinations thereof. Nitric acid and sulfuric acid are preferred inorganic acids.

Examples of organic acids include carboxylic and polycarboxylic acids such as formic acid, acetic acid, propionic acid, citric acid, oxalic acid, etc.; organic phosphorus acids such as dimethylphosphoric acid and dimethylphosphinic acid; or sulfonic acids such as methanesulfonic acid, ethanesulfonic acid, 1-pentanesulfonic acid, 1-hexanesulfonic acid, 1-heptanesulfonic acid, benzenesulfonic acid, toluenesulfonic acid, etc, and combinations thereof.

In one embodiment, after the metal foil has contacted the acidic solution, the metal foil is rinsed with a neutral solution. In one embodiment, water is used. In one embodiment, deionized water is used. In one embodiment, distilled water is used. In one embodiment water which has been treated with activated carbon to remove organics is used. Of course, such water treatments may be combined. The neutralizing or rinsing solution serves to remove excess acid from the surface of the metal foil in addition to neutralizing the surface of the metal foil.

Protective Film Formed by an Inert Silane, Titanate or Zirconate

In one embodiment, an article according to the present invention includes on the metal foil 12 a protective film or layer 20 of an inert silane, titanate or zirconate, which is applied by contacting the metal foil 12 with an inert silane, titanate orzirconate compound, typically via a solution of the inert silane, titanate orzirconate. In one embodiment, an inert silane, titanate orzirconate compound is applied directly to the surface 18 of the metal foil 12, to form the protective layer 20.

The inert silane compounds used to form the protective layer 20 include hydrocarbylsilanes, fluorocarbonsilanes and other inert silane compounds that bond to the metal foil and which thereafter present an inert outer or outwardly-facing surface which protects the surface of the metal foil from tarnish. In one embodiment, the inert silane, titanate and zirconate compounds have hydrocarbyl or substantially hydrocarbyl groups having from about 5 to about 20 carbon atoms attached to a central silicon, titanium or zirconium atom. In these inert silane, titanate and zirconate compounds, the compound bonds to the metal foil by one or more reactive groups and thereafter presents an inert outer or outwardly-facing surface which protects the surface of the metal foil from tarnish. In one embodiment, the hydrocarbyl groups in the inert silane, titanate and zirconate compound contains about 5 to about 100 carbon atoms. In one embodiment, the hydrocarbyl group in the inert silane, titanate and zirconate includes about 20 to about 60 carbon atoms. In one embodiment, the hydrocarbyl group in the inert silane, titanate and zirconate includes about 1 to about 20 carbon atoms. In one embodiment, the hydrocarbyl group in the inert silane, titanate and zirconate includes about 1 to about 8 carbon atoms. In one embodiment, the hydrocarbyl group in the inert silane, titanate and zirconate includes about 1 to about 4 carbon atoms.

The term "hydrocarbyl" includes hydrocarbon as well as substantially hydrocarbon groups. "Substantially hydrocarbon" describes groups which contain heteroatom substituents which do not alter the predominantly hydrocarbon nature of the group; that is, a substantially hydrocarbon substituent provides the same or substantially the same "inertness" to the inert silane, titanate or zirconate as would a purely hydrocarbon substituent of similar structure absent the substitution. Examples of hydrocarbyl groups include the following: (1) hydrocarbon substituents, i.e., aliphatic (e.g., alkyl or alkenyl), alicyclic (e.g., cycloalkyl, cycloalkenyl) substituents, aromatic-, aliphatic- and alicyclic-substituted aromatic substituents and the like as well as cyclic substituents wherein the ring is completed through another portion of the molecule (that is, for example, any two indicated substituents may together form an alicyclic radical), examples of such groups are methyl, ethyl, cyclohexyl, phenyl and tolyl; (2) substituted hydrocarbon groups, that is, groups containing non-hydrocarbon substituents which, in the context of this invention, do not alter the predominantly hydrocarbon, i.e., inert, nature of the substituent; those skilled in the art will be aware of such groups (e.g., fluoro, chloro, etc.); and (3) heteroatom-containing substituents, i.e., substituents which, while having a predominantly hydrocarbon character within the context of this invention, contain an atom other than carbon present in a ring or chain otherwise composed of carbon atoms (e.g., alkoxy, ether, mercaptan).

In general, no more than about 2 hetero substituents (on average) are present for every ten carbon atoms in the hydrocarbyl group. In one embodiment, no more than about 1 hetero substituent (on average) is present for every ten carbon atoms in the hydrocarbyl group. In one embodiment, there are no such hetero atom substituents in the hydrocarbyl group. In one embodiment, the hydrocarbyl group is one of an unsubstituted alkyl group, an unsubstituted cyclic alkyl group, or an unsubstituted aromatic group.

General examples of inert silane compounds include alkyl silanes, cycloalkyl silanes, aromatic silanes, substituted aromatic silanes, and fluorocarbon silanes. In one embodiment, the inert silane compound may be represented by the formula

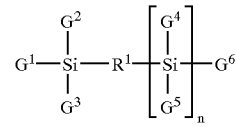

wherein $G^1$, $G^2$, $G^3$, $G^4$, $G^5$ and $G^6$ are independently hydrocarbyl, or hydrocarbyloxy groups; $R^1$ is a hydrocarbyl group; and n is zero or 1. In one embodiment at least one of each of $G^1$, $G^2$, $G^3$, $G^4$, $G^5$ and $G^6$ may be independently alkoxy, and $R^1$ may be an alkylene group of up to about 10 carbon atoms, or an aryl group of up to about 10 carbon atoms. In one embodiment, at least one of $G^1$, $G^2$, $G^3$, $G^4$, $G^5$ and $G^6$ is a hydrocarbyl group or a fluorocarbon group. In one embodiment, at least one of $G^1$, $G^2$, $G^3$, $G^4$, $G^5$ and $G^6$ is an alkoxy group and the remainder are independently hydrocarbyl groups or fluorocarbon groups. In one embodiment each of $G^1$, $G^2$, $G^3$ and $G^6$ is an alkoxy group of up to about 10 carbon atoms, $G^4$ and $G^5$ are hydrocarbyl and n is one. In one embodiment, at least two of $G^1$, $G^2$, $G^3$, $G^4$, $G^5$ and $G^6$ are alkoxy and the remainder are independently hydrocarbyl groups or fluorocarbon groups. Examples of such inert silane compounds include 1,2-bis (trimethoxysilyl)ethane, 1,2-bis(dimethoxyethylsilyl) ethane, bis(trimethoxysilylethyl)benzene, 1,6-bis (trimethoxysilyl)hexane and 1,6-bis(diethoxyethylsilyl) hexane.

In another embodiment, the inert silane compound may be a compound represented by the formula

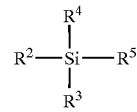

wherein $R^2$, $R^3$, $R^4$ and $R^5$ are independently hydrogen, a hydrocarbyl group, a fluorocarbon group, a hydrocarbyloxy group, or a hydroxy group. In one embodiment, each of $R^3$, $R^4$ and $R^5$ are either methoxy or ethoxy, and $R^2$ is a hydrocarbyl group or a fluorocarbon group. In one embodiment, each of $R^4$ and $R^5$ are methoxy or ethoxy, and $R^2$ and $R^3$ are hydrocarbyl groups.

Examples of these inert silane compounds include methyltrimethoxysilane; ethyltrimethoxysilane; propyltrimethoxysilane; n-butyltrimethoxysilane; isobutyltrimethoxysilane; pentyltrimethoxysilane; hexyltrimethoxysilane; octyltrimethoxysilane; 7-oct-1-enyltrimethoxysilane; phenyltrimethoxysilane; the corresponding ethoxy and propoxy substituents replacing the methoxy substituents; hydrocarbyl substituted phenyltrimethoxysilanes such as p-(methyl) phenyltrimethoxysilane; 3-cyclopentadienylpropyl trimethoxysilane; vinyl trimethoxysilane; allyl trimethoxysilane; methoxypropyl trimethoxysilane; methyl triethoxysilane; ethyl triethoxysilane; propyl triethoxysilane; n-butyl triethoxysilane; isobutyl triethoxysilane; pentyl triethoxysilane; hexyl triethoxysilane; octyl triethoxysilane; 7-oct-1-enyl triethoxysilane; phenyl triethoxysilane; hydrocarbyl substituted phenyl triethoxysilane such as p-(methyl) phenyl triethoxysilane; 3-cyclopentadienylpropyl triethoxysilane; vinyl triethoxysilane; allyl triethoxysilane; methoxypropyl triethoxysilane; methyl triisopropoxysilane; ethyl triisopropoxysilane; propyl triisopropoxysilane; vinyl triisopropoxysilane; vinyl tris-t-butoxysilane; 3,3,3-trifluoropropyl trimethoxysilane; and tridecafluoroctyl triethoxysilane.

Mixtures of two or more of the inert silane compounds listed above may be used. For example, in one embodiment, the inert silane compound is methyltrimethoxysilane or isobutyltrimethoxysilane in combination with propyltrimethoxysilane. In another embodiment, the inert silane compound is a fluorocarbonsilane in combination with an alkyl silane. In yet another embodiment, the inert silane compound is 3,3,3-trifluoropropyl trimethoxysilane in combination with propyl trimethoxysilane.

The titanate compounds that may be used to form the protective layer 20 include di(cumyl)phenyl oxoethylene titanate; di(dioctyl)pyrophosphate oxoethylene titanate; isopropyl triisostearoyl titanate; isopropyl dimethacryl isostearoyl titanate; isopropyl tri(dodecyl)benzenesulfonyl titanate; isopropyl tri(dioctyl)phosphato titanate; isopropyl (4-amino)benzenesulfonyl di(dodecyl)benzenesulfonyl titanate; isopropyl tri(dioctyl)pyrophosphato titanate; tetraoctyl di(ditridecyl)phosphito titanate; tetra (2,2 diallyoxymethyl)butyl,di(ditridecyl)phosphito titanate; neopentyl(diallyl)oxy, trineodecanonyl titanate; neopentyl (diallyl)oxy-tri(dodecyl)benzene-sulfonyl titanate; neopentyl(diallyl)oxy-tri(dioctyl)phosphato titanate; neopentyl(diallyl)oxy-tri(dioctyl)pyrophosphato titanate; and mixtures of two or more thereof. These compounds are sometimes referred to as titanate coupling agents.

The zirconate compounds that may be used to form the protective layer 20 include neopentyl(diallyl)oxy-tri (dioctyl)phosphato zirconate. These compounds are sometimes referred to as zirconate coupling agents.

Mixtures of two or more of the foregoing silane, titanate and/or zirconate compounds can be used to form the protective layer 20.

The inert silane, titanate or zirconate compound solution may be in the form of a dispersion or solution in water, a mixture of water and alcohol, or a suitable organic solvent, or as an aqueous emulsion of the inert silane, titanate or zirconate compound, or as an aqueous emulsion of absolution of the inert silane, titanate or zirconate compound in a suitable organic solvent. Conventional organic solvents may be used. These include alcohols, ethers, ketones, and mixtures of these with aliphatic or aromatic hydrocarbons or with amides such as N,N-dimethylformamide. Useful solvents are those having good wetting and drying properties and include, for example, water, methanol, ethanol, isopropanol, and methylethylketone. Aqueous emulsions of the inert silane, titanate or zirconate compound may be formed in conventional manner using conventional dispersants and surfactants, including nonionic dispersants.

In one embodiment, the step of contacting the metal foil with the inert silane, titanate or zirconate solution may be repeated, if desired, several times. However, a single step gives generally useful results and, hence, in one embodiment the contacting step is a single step, not repeated. Contact is accomplished via suitable application methods which include reverse roller coating, doctor blade coating, dipping, immersing, painting and spraying, although immersing the metal foil in the inert silane, titanate or zirconate solution is preferred.

In one embodiment, the inert silane, titanate or zirconate compound is present in the solution in an amount from about 0.01% to about 10% v/v. In another embodiment, the inert silane, titanate or zirconate compound is present in the solution in an amount from about 0.05% to about 5% v/v. In yet another embodiment, the inert silane, titanate or zirconate compound is present in the solution in an amount from about 0.1% to about 2% v/v.

In one embodiment, the inert silane, titanate orzirconate compound or the inert silane, titanate or zirconate compound solution are at a temperature from about 10° C. to about 50° C. during the step of contacting the foil with the inert silane, titanate or zirconate. In another embodiment, the inert silane, titanate or zirconate compound solution is at a temperature from about 15° C. to about 40° C. during the step of contacting. In yet another embodiment, the inert silane, titanate or zirconate compound solution is at a temperature from about 20° C. to about 30° C. during the step of contacting.

In one embodiment, during the step of contacting the metal foil is in contact with the inert silane, titanate or zirconate compound solution for a time sufficient for a protective film to form on a surface of the metal foil. In one embodiment, the metal foil is in contact with the inert silane, titanate or zirconate compound solution from about 1 second to about 10 minutes. In another embodiment, the metal foil is in contact with the inert silane, titanate or zirconate compound solution from about 5 seconds to about 100 seconds. In one embodiment, after the metal foil is contacted with the inert silane, titanate or zirconate compound solution during the step of contacting, the metal foil is permitted to dry. In one embodiment, the metal foil is heated for a suitable period of time to drive off solvent and form an inert silane, titanate or zirconate compound film. In one embodiment, the metal foil is heated to a temperature from about 50° C. to about 170° C. In another embodiment, the metal foil is heated to a temperature from about 70° C. to about 150° C. In one embodiment, the metal foil is heated for about 1 second to about 5 minutes. In another embodiment, the metal foil is optionally heated for about 10 seconds to about 2 minutes.

The inventive treatment forms a protective film on at least one surface of the metal foil. The protective film may be continuous, substantially continuous or non-continuous, so long as the film prevents tarnish from forming on the treated metal foil surface. In one embodiment, the protective film is continuous or at least substantially continuous over the treated metal foil surface. In one embodiment, the protective film of the inert silane, titanate or zirconate compound on the metal foil has a thickness from about 0.001 to about 1 micron. In another embodiment, the protective film of the inert silane, titanate or zirconate compound on the metal foil has a thickness from about 0.0025 to about 0.1 microns. In yet another embodiment, the protective film of the inert silane, titanate or zirconate compound on the metal foil has a thickness from about 0.005 to about 0.05 microns.

In one embodiment, the inert silane, titanate or zirconate compound solution contains certain additives. In one embodiment, the inert silane, titanate or zirconate compound solution does not contain any additives. In another embodiment, the inert silane, titanate or zirconate compound solution contains as an additive one or more triazole compounds. Triazole compounds include aminotriazoles, benzotriazole, hydroxybenzotriazole, alkyl substituted benzotriazoles such as methylbenzotriazole, and carboxylbenzotriazole. In one embodiment, the inert silane, titanate or zirconate compound solution contains from about 0.01 g/l to about 10 g/l of one or more of the foregoing triazole additives. In another embodiment, the inert silane, titanate or zirconate compound solution contains from about 0.1 g/l to about 5 g/l of one or more of the foregoing triazole additives.

In one embodiment, the inert silane, titanate or zirconate compound solution is metal free; that is, the inert silane, titanate or zirconate compound solution is characterized by the absence of added metals or metal compounds (other than the titanium of the titanate and the zirconium of the zirconate). In some instances metal compounds deleteriously affect the resultant inert silane, titanate orzirconate compound film formed. In one embodiment, after the metal foil is treated in accordance with the invention, no electrolytic step is performed.

The absence of additional electrolytic steps simplifies methods of making metal foil as well as simplifying the fabrication of laminates for printed circuit boards. In one embodiment, after the metal foil has contacted the inert silane, titanate or zirconate compound, during the step of contacting the metal foil is rinsed with a neutral solution. In one embodiment, the metal foil is rinsed with water. In one embodiment, the metal foil is rinsed with deionized water. In one embodiment, distilled water is used. In one embodiment water which has been treated with activated carbon to remove organics is used. Of course, such water treatments may be combined. The rinse serves to remove excess materials from the surface of the treated metal foil.

Metal Sheets

The metal of which the metal sheet 16 may be formed is not limited to any particular metal. In one embodiment, the metal sheet 16 is aluminum. In one embodiment, the metal sheet 16 comprises aluminum. In one embodiment, the metal sheet 16 is an aluminum alloy. In one embodiment, the metal sheet 16 is an aluminum alloy formulated to provide enhanced hardness with respect to aluminum. In general, aluminum is preferred for economic reasons, since the aluminum sheet may be used one time and discarded for recycling and remanufacture, rather than being reused after possible contamination by handling and use.

In one embodiment, the metal sheet 16 is a metal other than aluminum. In one embodiment, the metal sheet comprises an alloy containing copper. In one embodiment, the metal sheet comprises iron. In one embodiment, the metal sheet is stainless steel. In other embodiments, the metal sheet may comprise aluminum, nickel, tin, silver, gold, chromium, zinc, platinum, palladium, iron, lead, steel, brass, bronze, alloys thereof and alloys of any of the foregoing metals with copper. Examples of such alloys include copper-zinc, copper-silver, copper-tin, chromium-molybdenum and nickel-chromium. In one embodiment, the metal sheet comprises an alloy of aluminum with one or more of tin, zinc, titanium, silicon, copper, manganese, magnesium and chromium. In one embodiment, the metal sheet comprises an alloy of aluminum, iron, tin, zinc, titanium, silicon, copper, manganese, magnesium and chromium.

In one embodiment, the metal sheet 16 is a metal which is more active on the electrochemical scale than is the metal of which the metal foil is formed. For example, aluminum is a more active metal than copper. In other embodiments, the metal sheet may be a metal other than aluminum. In general, the metal of the metal sheet is different from the metal of the metal foil. In other embodiments, the metal of the metal sheet may be another metal selected from those mentioned above. In some embodiments, economic considerations dictate that the metal of the metal sheet be a more electrochemically active metal than the metal of the metal foil, since such metals may be more economical to use. The difference in electrochemical activities between the different metals give rise to the need for the present invention. In the absence of application of the method of the present invention, tarnish of the metal foil results from the electrochemical force generated by the difference in electrochemical activities between the different metals. Thus, the present invention allows use of more electrochemically active but less expensive metals, without sacrificing the quality of the metal foil.

The metal sheet 16 may have a thickness ranging from about 1 mil (0.025 mm)to about 250 mils inch (6.35 mm). In one embodiment, the metal sheet may have a thickness ranging from about 5 mils (0.125 mm) to about 25 mils (0.63 mm). In one embodiment, the metal sheet may have a thickness ranging from about 10 mils (0.25 mm) to about 20 mils (0.5 mm). In one embodiment, the metal sheet may have a thickness ranging from about 5 mils (0.125 mm) to about 15 mils (0.375 mm). In one embodiment, the metal sheet may have a thickness ranging from about 15 mils (0.375 mm) to about 25 mils (0.63 mm).

In the embodiment shown in FIGS. 4–5, surfaces of the metal sheet to which the metal foils will be adjacent may be clean, i.e., virgin metal untreated in any way other than cleaning, such as degreasing and/or washing. The metal sheet 16 may be treated with a release material. The release material is a polymeric resin initially applied, for example, by a spraying process which deposits a coating of release material from about 1 to about 5 microns in thickness on the metal sheet 16. If the release material is applied from a solution, in the drying and curing process, solvent in the release material flashes off, leaving the coating. The polymeric resin may be one of a number of resins which are thermally stable to approximately 375° C. Exemplary polymeric resins are disclosed in U.S. Pat. No. 4,875,283, which is incorporated herein by reference for its teachings of such release materials. In one embodiment, the release material may be a silicon-containing polymerizable resin sold under the trade name FREKOTE® 700 or FREKOTE® 700-NC by FREKOTE, Inc., a subsidiary of the Dexter Corporation of Seabrook, N.H. As noted above, the release material provides for easier separation of the metal foils from the metal separator sheet.

Laminates

As noted, the metal foils treated in accordance with the present invention can be bonded to dielectric substrates on the side opposite to the side attached or adjacent to the metal sheet. With the inventive foils, either the matte side or shiny side can be bonded to a dielectric substrate, but the side of the foil treated in accordance with the present invention is not initially bonded to a dielectric substrate (however, in the case of double treated foil, both sides may eventually be bonded to dielectric substrates).

Useful dielectric substrates may be prepared by impregnating woven glass reinforcement materials with partially cured epoxy resins (e.g., difunctional, tetrafunctional and multifunctional epoxies), polyimide resins, or polyester resins. These dielectric substrates are sometimes referred to as prepregs, such as epoxy prepregs.

In preparing the laminates, it is useful for both the prepreg material and the metal foil to be provided in the form of long webs of material rolled up in rolls. In one embodiment, these long webs of metal foil, metal sheet and prepreg are laminated using a continuous process. In this process, a continuous web of the article comprising the metal foil with the inert silane, titanate or zirconate and the metal sheet, optionally with an adhesion promoting layer adhered thereto, is brought into contact with a continuous web of prepreg material under laminating conditions to form a laminate structure. This laminate structure is then cut into rectangular sheets and the rectangular sheets are then laid-up or assembled in stacks of assemblages.

In the third embodiment in which the metal foils are attached to each other and surround the metal sheet, the long webs of prepreg material are first cut into rectangular sheets and then subjected to lamination. In this embodiment square or rectangular articles comprising the metal foil with inert silane, titanate or zirconate and the metal sheets and square or rectangular sheets of the prepreg material are then laid-up or assembled in stacks of assemblages referred to as "books."

Each assemblage may comprise a prepreg sheet with an article comprising the metal foil with inert silane, titanate or zirconate and the metal sheet on either side thereof, and in each instance, the adhesion bonding treated side (or one of the sides) of the metal foil is positioned adjacent the prepreg. The metal sheet is attached to the side of the metal foil away from the prepreg, i.e., the side which has been treated with an inert silane. Thus, the side of the metal foil processed in accordance with the present invention is facing away from the prepreg material. The assemblage may be subjected to conventional laminating temperatures and pressures between the plates of laminating presses to prepare laminates comprising sandwiches of a sheet of prepreg between sheets of metal foil.

The prepregs may consist of a woven glass reinforcement fabric impregnated with a resin, such as a partially cured two-stage resin in embodiments where an epoxy resin is employed. By application of heat and pressure, the untreated (in accordance with the present invention) side of the copper foil is pressed tightly against the prepreg and the temperature to which the assemblage is subjected activates the resin to cause curing, that is crosslinking of the resin, which results in tight bonding of the foil to the prepreg dielectric substrate. Generally, the laminating operation will involve pressures in the range of from about 100 psi to about 1,000 psi, temperatures in the range of from about 150° C. to 250° C. and a laminating cycle of from about 10 minutes to about 3 hours. The finished laminate may then be utilized to prepare printed circuit boards (PCB). In one embodiment, the inert silane, titanate or zirconate compound is removed from the copper surface after lamination.

In one embodiment, the laminate is subjected to a subtractive copper etching process to form electrically conductive lines or an electrically conductive pattern as part of a process for making a multilayered circuit board. The inert silane, titanate or zirconate treatment is next removed from the patterned metal. A second bonding treatment may then be conducted on the surface of the etched pattern using the techniques discussed above (e.g., barrier and/or treatment layers applied) and then a second prepreg may be adhered to the etched pattern. The etched pattern exhibits good dimensional control since tarnish is not present so does not effect the etching process. The techniques for making multilayered circuit boards are well known in the art.

A number of manufacturing methods are available for preparing PCBs from laminates. Additionally, there is a myriad of possible end use applications including radios, televisions, computers, etc., for the PCB's. These methods and end uses are known in the art.

One advantage resulting from the present invention is that the treated metal foils including the protective film obtained in accordance with the invention exhibit high tarnish resistance when used in connection with metal sheets during lamination to prepregs. This is because the inventive method provides a protective film of an inert silane, titanate or zirconate on the metal foil which maintains a tarnish barrier during processing of the treated metal foil. Another advantage is that the treated metal foil exhibits excellent pattern ability when later etching the foil.

In embodiments where double treated foil is treated in accordance with the present invention, or where it is desirable to remove the protective film, the treated metal foil is contacted with a dilute aqueous or organic acid or base solution.

While not wishing to be bound by any theory, it is believed that the individual molecules of the inert silane, titanate or zirconate compound are positioned on the surface of the metal foil so that the reactive portion, e.g., an alkoxy group, reacts with and/or is adjacent the metal foil surface while the nonpolar, inert substituent, e.g., hydrocarbyl or fluorocarbon group, is positioned away from the metal foil surface. The nonpolar nature of the inert silane, titanate or zirconate substituent is believed to help prevent tarnish from forming on the metal foil surface due to electrolysis, oxidation-reduction, or replacement reactions between the metal foil surface and the facing metal sheet which is formed of a different metal by forming a non-reactive surface. In addition, the reactive portions of the inert silane, titanate or zirconate have reacted with and thus "tied up" any reactive sites on the surface of the metal foil. Thus, it is believed the inert silane acts as an insulator, to insulate the metal foil from the metal sheet, which is made of a different metal. The inert, non-reactive portions of the inert silane, titanate or zirconate are believed to form a barrier to prevent water molecules from reaching the surface of the metal foil, thus preventing formation of an electrochemical cell, or battery, between the metal foil and the metal separator sheet comprising a metal different from that of the metal foil.

While not intending to be limited thereby, the following examples illustrate various and novel aspects of the present invention. Unless otherwise indicated, in the following examples, as well as throughout the specification and claims, all parts and percentages are by weight, all temperatures are in degrees Celsius, and all pressures are atmospheric. Throughout the specification, the upper and lower limits of all disclosed ranges may be combined.

EXAMPLE 1

Laminates are made using CAC (copper-aluminum-copper) to compare copper foil treated with an inert silane according to the present invention with copper foil treated with standard stabilization treatments, but not with the inert silane of the present invention.

All copper foils are treated on both sides with a standard metal stabilization layer, specifically a zinc-chromium alloy having a thickness of about 0.001 micron.

In an example of the present invention, 36 sheets of copper foil are treated on both sides with a 0.5% v/v solution of propyltrimethoxysilane in a mixture of water and alcohol, by spraying each sheet of copper foil with the solution, followed by squeegeeing, followed by oven drying. The treatment with the inert silane produces a protective film having a thickness of about 0.001 micron on the surface of the copper foil.

As a comparative example, 74 sheets of copper foil are not treated with the inert silane of the present invention, but are used to form CAC articles with no protective layer.

CAC articles are prepared by attaching the shiny side of each of two 2 oz/ft$^2$ copper foils to an aluminum sheet by applying an adhesive around the perimeter of the metal sheet.

The matte side of each copper foil, i.e., the side facing away from the aluminum sheet, is laminated to a Polyclad ATS 140° C. T$_g$ epoxy prepreg. The lamination is carried out under standard conditions, such as a pressure of 250 psi, a temperature of 177° C., for a time of 1 hour, followed by cooling to room temperature.

After cooling, the aluminum sheet is removed from each of the newly formed laminates, and the surface of the copper foil (the treated shiny side) is immediately inspected for the presence of any traces of tarnish.

Of the 74 sheets of the comparative copper foil, 17 (23%) show some degree of tarnish.

Of the 36 sheets of the exemplary copper foil treated in accordance with the present invention, none show tarnish.

EXAMPLE 2

Nine silane solutions (6 inert silane solutions in accordance with the present invention and 3 comparative silane solutions) are prepared containing about 1% v/v of the subject silane compound, water, and ethanol as needed to dissolve the silane compounds. The silane compounds are applied to the shiny side of a 1 oz/ft$^2$ copper foil, the matte side of which had been treated with a mixture of zinc and chromium, by dipping into the silane solution with a dwell time of about 20 seconds, rinsing with water, and then drying for about 1 minute at about 100° C. The control foil does not have any silane compound applied thereto. The shiny side of each copper foil, after this treatment with the appropriate silane (or with no silane treatment, in the control), is attached to an aluminum sheet by a flexible adhesive, in a manner similar to that shown in FIG. 3, i.e., by applying a bead of adhesive to the perimeter of the aluminum sheet and applying the treated copper foil thereto. The matte side of each copper foil, i.e., the side facing away from the aluminum sheet, is then laminated to an epoxy prepreg layer (a Polyclad ATS 140° C. T$_g$ epoxy prepreg or a General Electric TS epoxy prepreg). The matte sides of the copper foils are laminated to the epoxy prepreg under standard conditions, such as at 250 psi pressure, at about 177° C., and are held together for about 1 hour, followed by cooling to room temperature.

After cooling, the aluminum sheet is removed from each of the newly formed laminates, and the surface of the copper foil (the shiny side) is immediately inspected for the presence of any traces of tarnish. Table 1 shows the result, i.e., whether tarnish is observed on the shiny side of the copper foils, after the copper foils are separated from the attachment to the aluminum sheet. In classifying the observed degree of tarnish, "heavy" tarnish means that a significant amount of tarnish, i.e., more than a minor amount of discoloration characteristic of an initial tarnishing, is observed on the copper foil; "some" tarnish means that a minor amount of the discoloration characteristic of the initial tarnish is observed on some areas of the copper foils; and "none" means that the copper foil appears in substantially pristine condition with no evidence of tarnish formation observable. In each example, the silane compounds are trimethoxysilanes with the fourth silicon substituent specified in Table 1.

TABLE 1

| Silane | Tarnish |
| --- | --- |
| control | Heavy |
| methyl | None |
| propyl | None |
| isobutyl | None |
| octyl | None |
| trifluoropropyl | None |
| phenyl | None |
| aminopropyl | Some |
| hydroxypropyl | Some |
| glycidoxypropyl | Some |

As shown by the foregoing results, when an inert silane is applied to the shiny side of a metal foil, and the shiny side is thereafter attached to a metal sheet of a metal different from the metal foil, and the article thus formed is laminated to a prepreg, the inert silane protects the shiny side of the metal foil from tarnish. A foil which is not treated an inert silane, titanate or zirconate and so lacks the protective film becomes tarnished. A foil which is treated with non-inert silanes is not protected from tarnish, and suffers some tarnish, as shown in the foregoing Table 1. In Table 1, the foils treated with a non-inert silane and the foil treated with no silane show tarnish after a short storage and lamination under standard prepreg laminating conditions. In contrast, the foils treated with an inert silane in accordance with the present invention, did not show tarnish after a short storage and lamination under standard prepreg laminating conditions.

While the invention has been explained in relation to its preferred embodiments, it is to be understood that various methods thereof will become apparent to those skilled in the art upon reading this specification. Therefore, it is to be understood that the invention disclosed herein is intended to cover such modifications falling within the scope of the appended claims.

What is claimed is:

1. A method of increasing tarnish resistance of a metal foil of a first metal attached or held adjacent to a metal sheet of a second metal, comprising:

contacting at least one side of the metal foil with an inert silane, titanate or zirconate compound to form a protective film having a thickness from about 0.001 microns to about 1 micron on a surface of the metal foil; and attaching or holding adjacent at least a portion of the metal foil having the protective film to the metal sheet.

2. The method of claim 1, wherein the inert silane compound comprises at least one hydrocarbyl silane.

3. The method of claim 1, wherein the inert silane compound comprises at least one fluorocarbonsilane.

4. The method of claim 1, wherein the inert silane compound comprises at least one of methyltrimethoxysilane; ethyltrimethoxysilane; propyltrimethoxysilane; n-butyltrimethoxysilane; isobutyltrimethoxysilane; pentyltrimethoxysilane; hexyltrimethoxysilane; octyltrimethoxysilane; 7-oct-1-enyltrimethoxysilane; phenyltrimethoxysilane; p-(methyl)phenyltrimethoxysilane; 3-cyclopentadienylpropyl trimethoxysilane; vinyl trimethoxysilane; allyl trimethoxysilane; methoxypropyl trimethoxysilane; methyl triethoxysilane; ethyl triethoxysilane; propyl triethoxysilane; n-butyl triethoxysilane; isobutyl triethoxysilane; pentyltriethoxysilane; hexyltriethoxysilane; octyltriethoxysilane; 7-oct-1-enyl triethoxysilane; phenyl triethoxysilane; p-(methyl)phenyl triethoxysilane; 3-cyclopentadienylpropyl triethoxysilane; vinyl triethoxysilane; allyl triethoxysilane; methoxypropyl triethoxysilane; methyl triisopropoxysilane; ethyl triisopropoxysilane; propyl triisopropoxysilane; vinyl triisopropoxysilane; vinyl tris-t-butoxysilane; 3,3,3-trifluoropropyl trimethoxysilane; and tridecafluoroctyl triethoxysilane.

5. The method of claim 1, wherein the inert silane compound comprises at least one alkyl silane.

6. The method of claim 1, wherein the inert silane compound comprises at least two inert silane compounds.

7. The method of claim 1, wherein said titanate compound is selected from the group consisting of di(cumyl)phenyl oxoethylene titanate; di(dioctyl)pyrophosphate oxoethylene titanate; isopropyl triisostearoyl titanate; isopropyl dimethacryl isostearoyl titanate; isopropyl tri(dodecyl) benzenesulfonyl titanate; isopropyl tri(dioctyl)phosphato titanate; isopropyl (4-amino)benzenesulfonyl di(dodecyl) benzenesulfonyl titanate; isopropyl tri(dioctyl) pyrophosphato titanate; tetraoctyl di(ditridecyl)phosphito titanate; tetra (2,2 diallyoxymethyl)butyl, di(ditridecyl) phosphito titanate; neopentyl(diallyl)oxy,trineodecanonyl titanate; neopentyl(diallyl)oxy-tri(dodecyl)benzenesulfonyl titanate; neopentyl(diallyl)oxy-tri(dioctyl) phosphato titanate; and neopentyl(diallyl)oxy-tri(dioctyl) pyro-phosphato titanate; and mixtures of two or more thereof.

8. The method of claim 1, wherein said zirconate is neopentyl(diallyl)oxy-tri(dioctyl)phosphate zirconate.

9. The method of claim 1, wherein said metal foil comprises copper.

10. The method of claim 1, wherein said metal sheet comprises aluminum.

11. The method of claim 1, wherein two said metal foils are attached or held adjacent to one metal sheet.

12. The method of claim 1, further comprising a step of laminating to a prepreg a side of the metal foil not attached or held adjacent to the metal sheet.

13. A method of increasing tarnish resistance of metal foil comprising:
contacting the metal foil with an inert silane compound to form a protective film having a thickness from about 0.001 microns to about 1 micron on a surface of the metal foil.

14. A method of treating metal foil comprising:
contacting a first side of the metal foil with a hydrocarbylsilane solution to form a protective film on a surface of the metal foil, the hydrocarbylsilane solution comprising from about 0.01% to about 10% v/v of a hydrocarbylsilane;
attaching or holding adjacent the first side to a metal sheet of a metal other than that of the metal foil; and
laminating a second side of the metal foil to a prepreg.

15. The method of claim 14, wherein the hydrocarbylsilane solution further comprises a triazole compound.

16. The method of claim 14, wherein the prepreg comprises at least one of an epoxy resin material, a polyimide resin material and a polyester resin material.

17. The method of claim 14, wherein said metal foil comprises copper.

18. The method of claim 14, wherein said metal sheet comprises aluminum.

19. The method of claim 14, wherein two said metal foils are attached or held adjacent to one metal sheet.

20. A method of making a laminate comprising:
contacting a copper foil with a solution comprising from about 0.05% to about 5% v/v of an alkyl silane;
attaching or holding adjacent a first side of the copper foil to an aluminum sheet; and
laminating the copper foil to an epoxy resin material.

21. The method of claim 20, wherein the alkyl silane comprises propyltrimethoxysilane.

22. The method of claim 20, wherein the solution comprises a mixture of water and an organic solvent.

23. The method of claim 20, wherein two said copper foils are attached or held adjacent to one aluminum sheet.

* * * * *